(12) United States Patent
Lim et al.

(10) Patent No.: US 8,707,897 B1
(45) Date of Patent: Apr. 29, 2014

(54) COMBINATORIAL PROCESSING CHAMBER HAVING ELECTRICAL CONTACTS

(75) Inventors: Greg Lim, San Jose, CA (US); Gauray Vorma, San Jose, CA (US); John Schmidt, San Jose, CA (US); Kurt Weiner, San Jose, CA (US); Zachary Fresco, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 1379 days.

(21) Appl. No.: 12/043,923

(22) Filed: Mar. 6, 2008

Related U.S. Application Data

(60) Provisional application No. 61/017,522, filed on Dec. 28, 2007.

(51) Int. Cl.
*C23C 14/00* (2006.01)
*B05C 11/10* (2006.01)
*G01N 27/00* (2006.01)

(52) U.S. Cl.
USPC ........ 118/712; 118/50; 422/82.01; 435/287.2

(58) Field of Classification Search
USPC ...................... 118/712, 713, 50; 156/345.47; 73/866.5; 435/287.2, 303.1; 422/82.01, 422/105, 112; 506/16
See application file for complete search history.

(56) References Cited

U.S. PATENT DOCUMENTS 6,479,301 B1 * 11/2002 Balch et al. ..................... 506/16
2009/0298160 A1 * 12/2009 Tajima et al. ............... 435/287.2

FOREIGN PATENT DOCUMENTS

WO  WO 2006038643 A1 * 4/2006

\* cited by examiner

*Primary Examiner* — Yewebdar Tadesse

(57) ABSTRACT

A reactor assembly having a plurality of reaction chambers defined therein is provided. The reactor assembly includes conductive leads that mate with contacts disposed on a substrate being combinatorially processed. The conductive leads may be disposed within walls of the reactor assembly so that one end of the lead mates with the contacts on the substrate or anywhere on the surface of a conductive blanket substrate, while the other end of the lead enables communication with an external monitoring or control device.

27 Claims, 8 Drawing Sheets

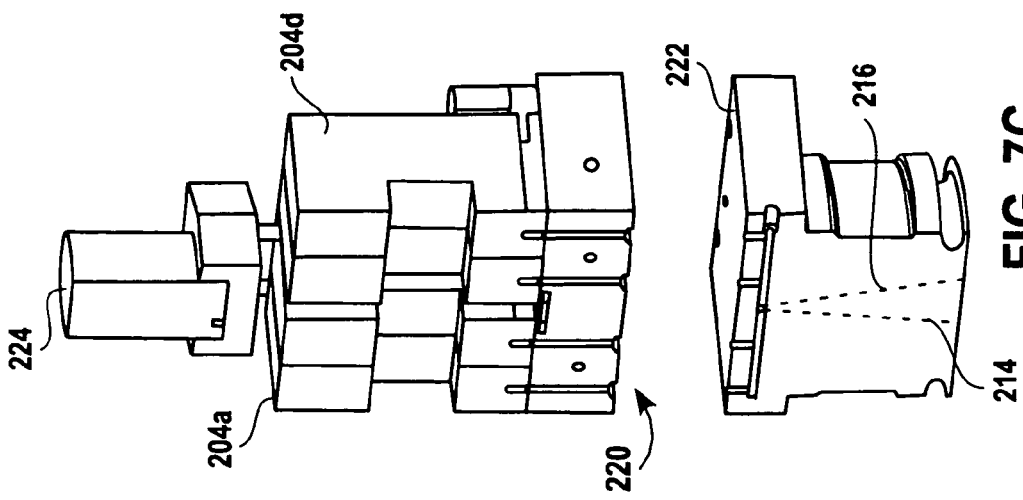
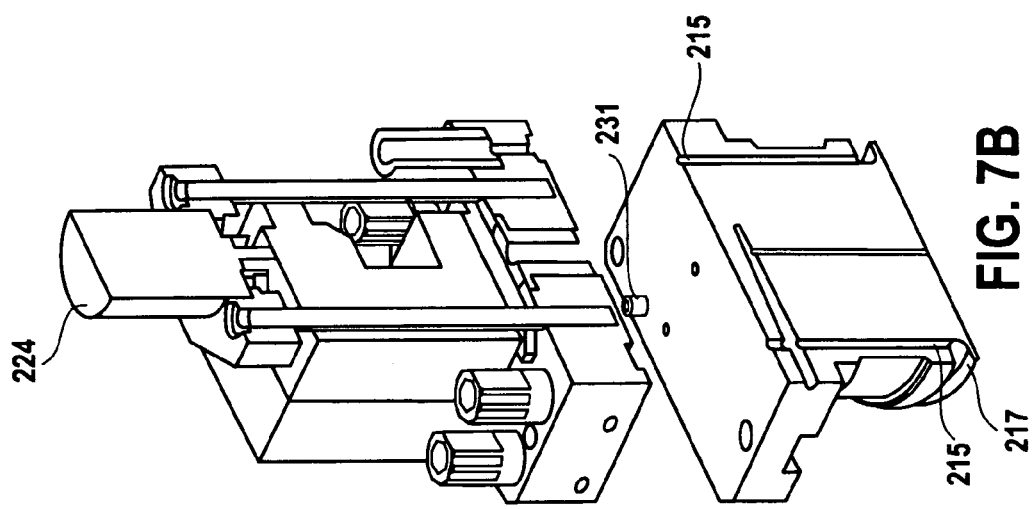
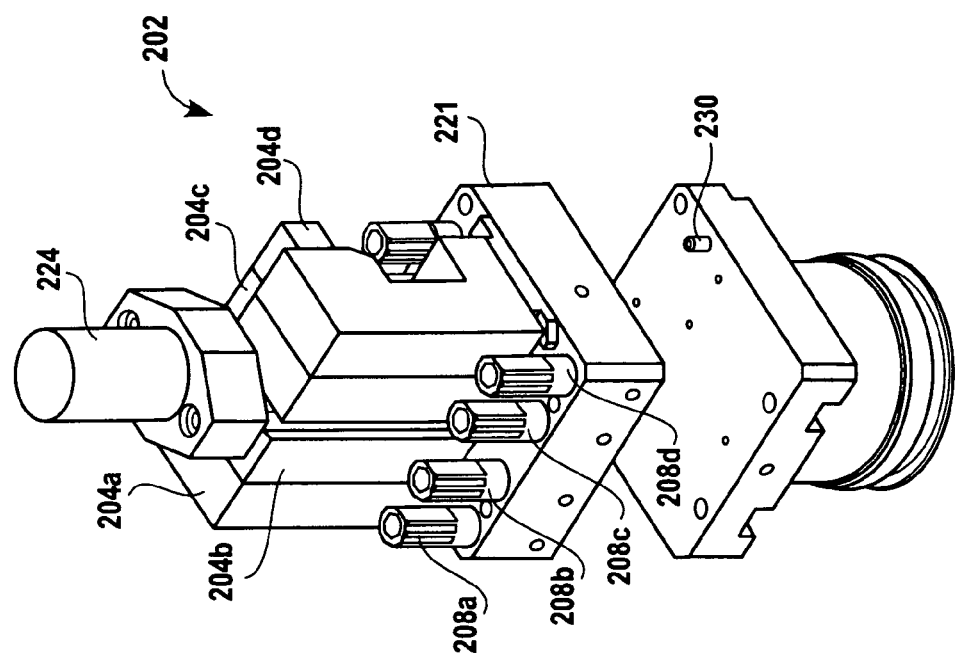
FIG. 7C
FIG. 7B
FIG. 7A

US 8,707,897 B1

COMBINATORIAL PROCESSING CHAMBER HAVING ELECTRICAL CONTACTS

CROSS-REFERENCE TO RELATED APPLICATION

This Patent Application claims priority to U.S. patent application No. 61/017,522 filed Dec. 28, 2007, entitled "COMBINATORIAL PROCESSING CHAMBER HAVING ELECTRICAL CONTACTS," which is incorporated herein by reference.

BACKGROUND

Combinatorial processing enables rapid evaluation of semiconductor processing operations. The systems supporting the combinatorial processing are flexible to accommodate the demands for running the different processes either in parallel, serial or some combination of the two.

Some exemplary semiconductor processing operations includes operations for adding (depositions) and removing layers (etch), defining features, preparing layers (e.g., cleans), doping, etc. Similar processing techniques apply to the manufacture of integrated circuit (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct R&D on full wafer processing through the use of split lots, as the deposition systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate.

An improved technique for accommodating gathering of additional data for multiple process variations on a single substrate is provided to enhance the evaluation of the viability of different materials, unit processes, or process sequences.

BRIEF DESCRIPTION OF THE DRAWINGS

The present invention will be readily understood by the following detailed description in conjunction with the accompanying drawings, and like reference numerals designate like structural elements.

FIGS. 7A through 7C illustrate a modular design of the flow cell that may be integrated into the embodiments of the invention.

DETAILED DESCRIPTION

Figure 1:
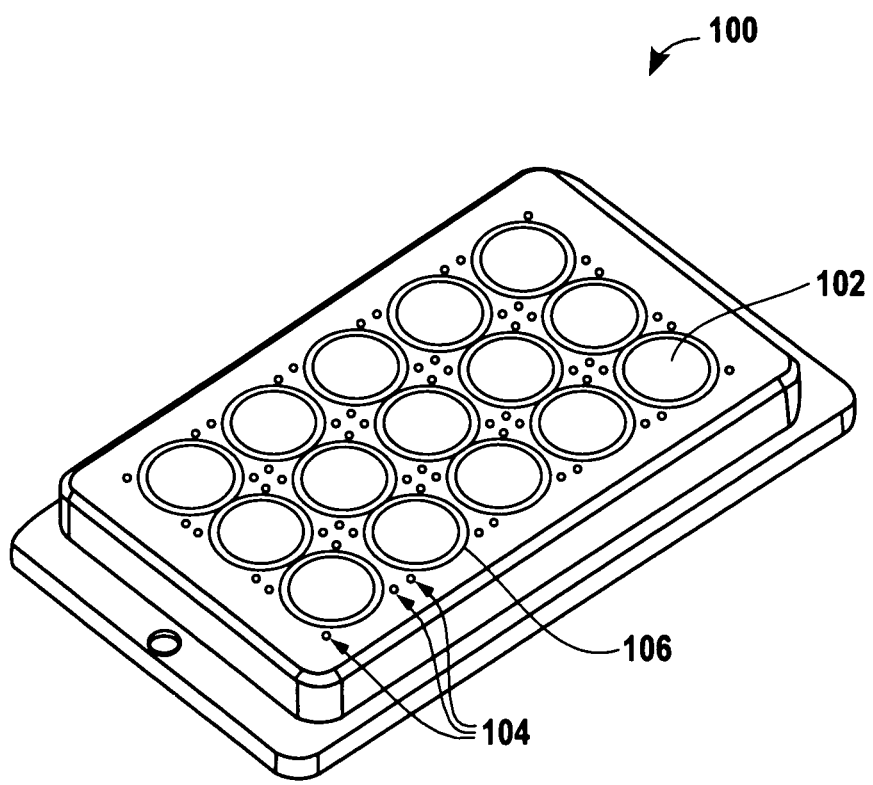
FIG. 1 is a simplified schematic diagram illustrating a bottom view of a reactor block in accordance with one embodiment of the invention.

The embodiments described herein provide a method and apparatus for providing electrical contacts for monitoring and influencing combinatorial processing of semiconductor processing operations. It will be apparent to one skilled in the art that the present invention may be practiced without some or all of these specific details. In other instances, well known process operations have not been described in detail in order not to unnecessarily obscure the present invention.

The embodiments described herein enable the application of combinatorial techniques for process sequence integration. Combinatorial processing applied to semiconductor manufacturing operations assists in arriving at a globally optimal sequence of semiconductor manufacturing operations by considering interaction effects between the unit manufacturing operations, the process conditions used to effect such unit manufacturing operations, as well as materials characteristics of components utilized within the unit manufacturing operations. The embodiments described below provide details for a multi-region processing system and associated reaction chambers that enable processing a substrate in a combinatorial fashion. In one embodiment, the different regions are isolated so that there is no interdiffusion between the different regions.

The embodiments are capable of analyzing a portion or subset of the overall process sequence used to manufacture semiconductor devices. Once the subset of the process sequence is identified for analysis, combinatorial process sequence integration testing is performed to optimize the materials, unit processes, and process sequence used to build that portion of the device or structure. During the processing of some embodiments described herein, the processing may take place over structures formed on the semiconductor substrate, which are equivalent to the structures formed during actual production of the semiconductor device. For example, structures may include, but not be limited to, trenches, vias, interconnect lines, capping layers, masking layers, diodes, memory elements, gate stacks, transistors, or any other series of layers or unit processes that create a structure found on semiconductor chips. While the combinatorial processing varies certain materials, unit processes, or process sequences, the composition or thickness of the layers or structures, or the action of the unit process is substantially uniform for each region. It should be noted that the process can be varied between regions, for example, a thickness of a layer is varied or one of various process parameters, such as a voltage, may be varied between regions, etc., as desired by the design of the experiment. The result is a series of regions on the substrate that contains structures or unit process sequences that have been uniformly applied within that region and, as applicable, across different regions. This process uniformity allows comparison of the properties within and across the different regions such that variations and test results are due to the parameter being modified, e.g., materials, unit processes, unit process parameters, or process sequences, and not the lack of process uniformity.

In addition, the combinatorial processing of the substrate may be combined with conventional processing techniques where substantially the entire substrate is processed, e.g., subjected to the same materials, unit processes, and process sequences. Thus, the embodiments described herein can pull a substrate from a manufacturing process flow, perform combinatorial processing, and return the substrate to the manufacturing process flow for further processing. Alternatively, a substrate can be processed in an integrated tool that allows both combinatorial and conventional processing in various chambers attached around the central chamber. Consequently, using one substrate, information concerning the varied processes and interaction of the varied processes with conventional processes can be evaluated. Accordingly, a multitude of data is available from a single substrate for desired processes.

The embodiments described below provide for the electrical monitoring and/or influencing of wet processing operations within a reaction chamber for a combinatorial processing system. Electrical contacts and leads mating with the contacts are provided to monitor or influence a reaction occurring within the reaction chamber. The contacts and leads are associated with each of the multiple reaction chambers of the combinatorial processing system. Thus, the electrical contacts may be used in an active manner to influence a reaction, e.g., by providing electricity for an electrodeposition operation, or in a passive manner to monitor electrical characteristics of the reaction occurring in the corresponding reaction chamber. The contacts are provided on a test substrate in one embodiment, while the leads to mate with the contacts are defined through the walls of a manifold defining the reaction chambers. These contacts may be placed within the test area, in an area where a sealing sleeve makes contact, or in an area outside the sealing area and the reaction area or test area. In one embodiment, a lead may be partially inside the reactor block and partially "floating" inside the reaction chamber for ECP and other suitable processes. For example, the lead may contact a fluid within the reaction chamber to provide a potential for an electrochemical deposition or some other suitable electrochemical reaction. While the embodiments illustrate contacts usually placed in a pattern to match the test chip/reactor cell pattern, fewer contacts may be used in other embodiments if an electrical parameter to be monitored or controlled is global to the entire test chip. As discussed in more detail below, numerous configurations may be defined for the location and placement of the contacts and corresponding leads.

FIG. 1 is a simplified schematic diagram illustrating a bottom view of a reactor block in accordance with one embodiment of the invention. Reactor block 100 includes a reaction manifold having a plurality of through-ways that define a plurality of reaction chambers 102. Reaction chambers 102 provide isolated regions when contacting a substrate surface so that the different regions of the plurality of reaction chambers 102 may be processed combinatorially in accordance with one embodiment of the invention. A reaction area within each reaction chamber 102 is defined by sidewalls of the reaction chamber, a top surface of a substrate and a bottom surface of a flow cell disposed within the reaction chamber. Proximate to each of reaction chambers 102 are electrical contacts or passageways 104. Electrical contacts or passageways 104 are in electrical communication with electrical test equipment in accordance with one embodiment of the invention. Electrical contacts or passageways 104 extend through the reactor block 100. An electrically conductive element such as a conductive lead is disposed within passageway 104 to provide an electrical connection between an external device and a substrate or a surface of the reaction area isolated by reaction chamber 102. Each reaction chamber 102 is optionally isolated through seal 106. As mentioned above, each of the electrical contacts or passageways 104 may be disposed outside of the sealing area, as illustrated in FIG. 1. Alternatively, the electrical contacts may be disposed within reaction chamber 102. In this embodiment, passageways 104 may traverse through reactor block 100 and then provide a pathway into the reaction area. In another alternative embodiment, the electrical contacts are provided through seal 106. For example seal 106 may be conductive and in electrical communication with one or more leads having access to seal 106.

Figure 2:
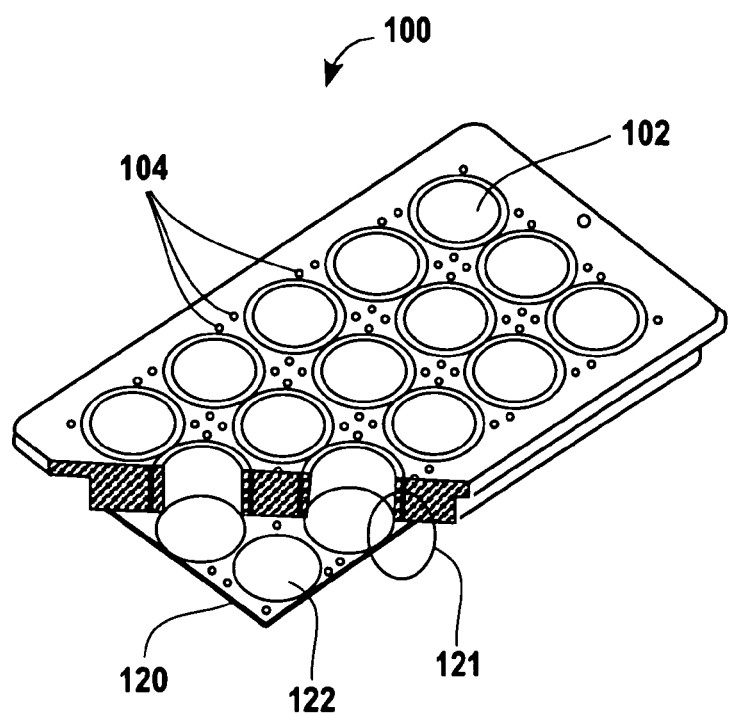
FIG. 2 is a top view of a reactor block in accordance with one embodiment of the invention.

FIG. 2 is a top view of reactor block 100 in accordance with one embodiment of the invention. In FIG. 2, reactor block 100 is disposed over substrate 120. Reactor block 100 includes a plurality of openings or through-ways, also referred to as reaction chambers 102, which define reaction regions on substrate 120. The sealing mechanism for reactor block 100 against substrate 120 in area 121 is further described in FIG. 3, and may be an o-ring, knife-edge, or other fluid seal that prevents interdiffusion between reaction regions 122 of the substrate 120. Reaction regions 122 defined on substrate 120 may be pre-defined reaction regions, which are aligned substantially with reaction chambers 102 of reaction block 100 in one embodiment. In another embodiment, the reaction chambers 102 will define reaction regions 122 on substrate 120. Reaction regions 122 are the areas of the substrate 120 that are differentially processed during combinatorial processing.

Figure 3:
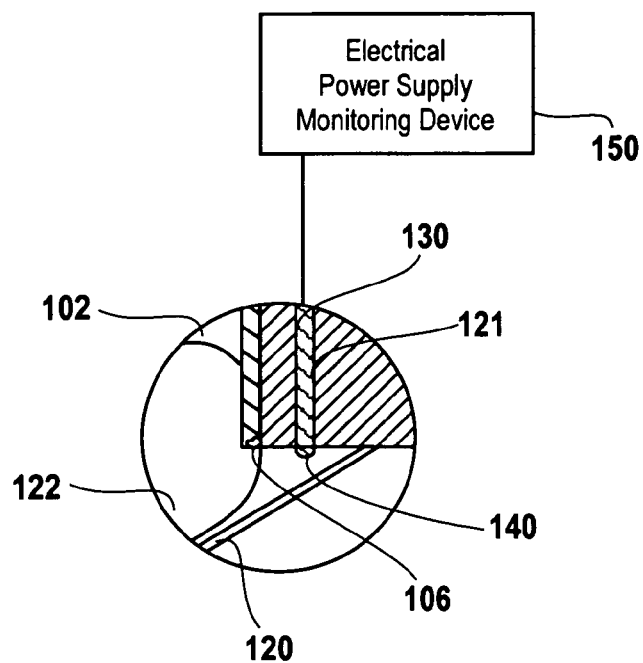
FIG. 3 is a simplified schematic diagram illustrating a detail view of the contact between a substrate and an electrical lead proximate to a reaction chamber or reaction region in accordance with one embodiment of the invention.

FIG. 3 is a simplified schematic diagram illustrating a detail view of the contact between a substrate and an electrical lead proximate to a reaction region of the substrate in accordance with one embodiment of the invention. Reaction region 122 of substrate 120 is optionally isolated through seal 106. Contact pad 140 of substrate 120 mates with conductive lead 130, which is disposed within reactor block 100. Conductive lead 130 may be any electrically conductive element, such as a copper or aluminum lead. An opposing end of lead 130 is in communication with electrical power supply or monitoring device 150. It should be appreciated that in one embodiment, a monitoring circuit may perform capacitance measurement. In this embodiment, the substrate 120 may or may not include structures or features and the contact would allow electrical test equipment to measure the capacitance as a reaction is taking place within reaction chamber 102. For example, reactions, such as electroless deposition or etching processes may utilize this technique and other in situ measurement techniques in order to provide further data for the combinatorial processing. Additionally, ex situ measurements (i.e., characterization of processed regions) can also be performed using the electrical leads. One skilled in the art will appreciate that resistance may also be similarly measured through lead 130. For example, a resistance thermal detector or thermistor may be included in the test chip. Thus, the temperature of the substrate may be monitored while the chemical reaction is taking place to provide useful data especially where a process is dependent on the reaction temperature. It should be appreciated that further electrical test (e-test) data, e.g., leakage, resistance, conductivity, capacitance, etc. can be obtained using these techniques.

Figure 4:
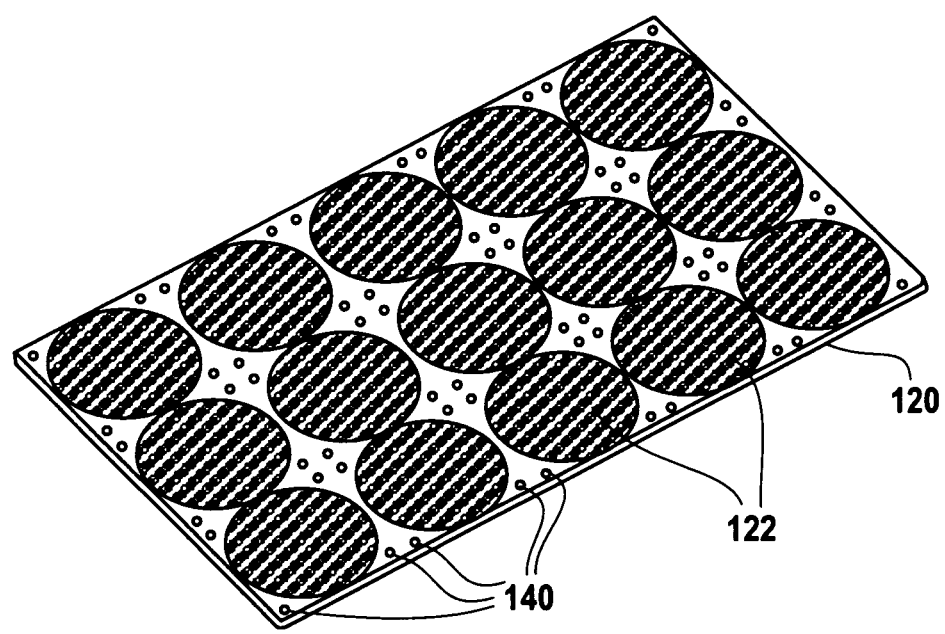
FIG. 4 is a simplified schematic diagram illustrating a test chip or substrate in accordance with one embodiment of the invention.

FIG. 4 is a simplified schematic diagram illustrating a test chip or substrate in accordance with one embodiment of the invention. Substrate 120 includes a plurality of reaction regions 122 having contact pads 140 proximate thereto. Contact pads 140 may be located within reaction region 122 in one embodiment. Substrate 120 may be a blanket substrate in one embodiment. Alternatively, substrate 120 may include a number of pre-defined reaction regions 122 and these pre-defined regions may include structures or devices thereon. These structures or devices may be typical semiconductor manufacturing structures or devices created during the semiconductor manufacturing process. In another embodiment, reaction regions 122 of substrate 120 may be electrically isolated from each other. One skilled in the art will appreciate that various configurations for substrate 120 are possible. While substrate 120 is depicted as rectangular, it should be appreciated that substrate 120 may be any suitable shape, e.g., circular, and system 100 can be adapted to accommodate numerous other shapes. The substrate may be provided with a thin contiguous copper seed layer disposed on a top surface in one embodiment. Alternatively, the reaction regions may be defined such that each reaction region is electrically isolated from each other through discontinuities in the copper seed layer in this embodiment. The discontinuities may be formed through a suitable etching process. In another embodiment, rather than a copper seed layer, a thin conductive film may be disposed on a top surface of the substrate. The contacts 140 disposed on the substrate 120 may be within the reaction regions 122 or outside the reaction regions 122. Substrate 120 may be a blanket substrate or a substrate having features (i.e., structures) disposed thereon or therein. Exemplary features include gate stacks, transistor features, vias, trenches, and other features or structures defined during the manufacturing of integrated circuits. Thus, numerous configurations are possible for substrate 120.

Figure 5:
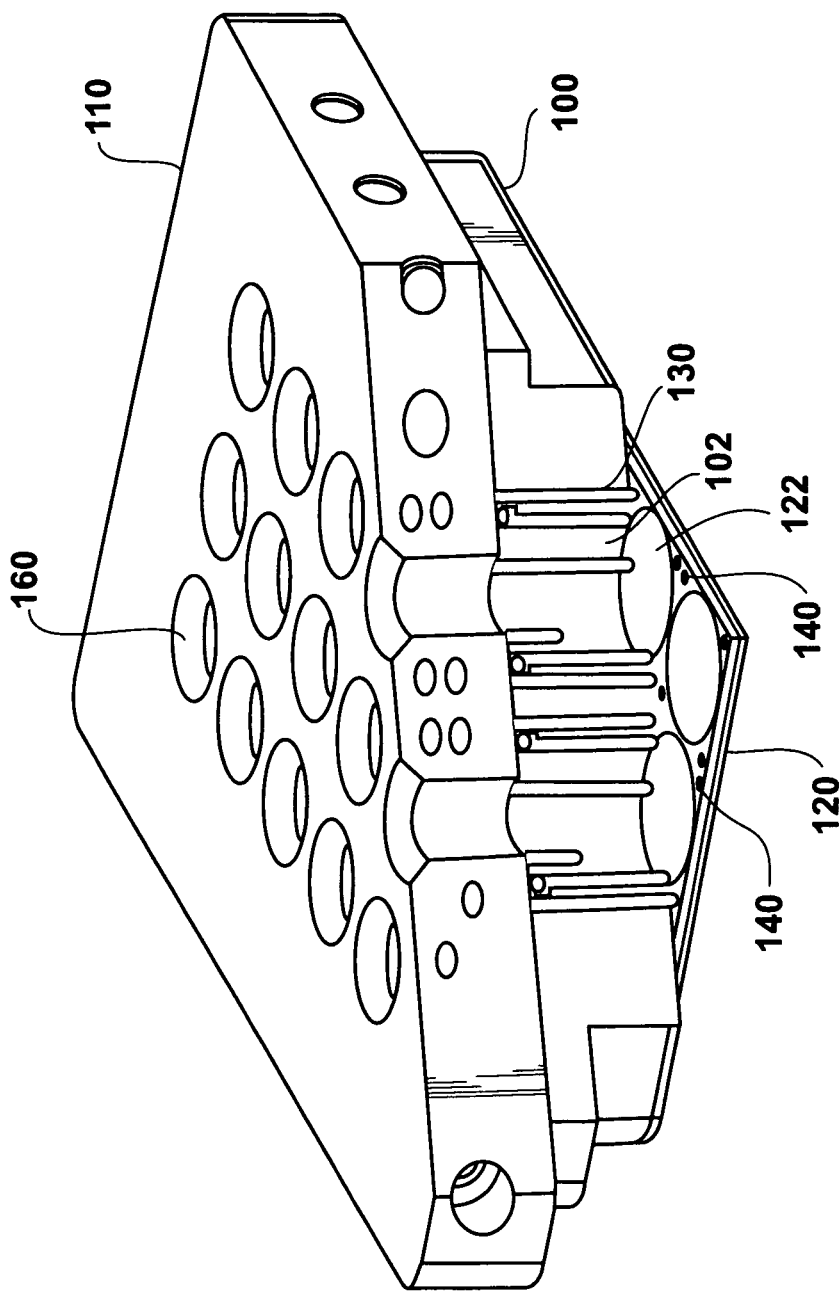
FIG. 5 is a simplified schematic diagram illustrating a cutaway view of the reactor assembly having electrical contacts in accordance with one embodiment of the invention.

FIG. 5 is a simplified schematic diagram illustrating a cutaway view of the reactor assembly having electrical contacts in accordance with one embodiment of the invention. The reactor assembly includes top plate 110 disposed over reactor block 100 which is disposed over substrate 120. In one embodiment, top plate 110, reactor block 100, and substrate 120 may be clamped against each other in order to provide pressure to seal a sleeve against the surface of the substrate and isolate reaction regions 122 from each other. A plurality of reaction chambers 102 are defined within reactor block 100. Leads 130 traverse through reactor block 100 and connect with contact pads 140 disposed on substrate 120. Alternatively, leads 130 can proceed into reaction chambers 102 and contact reaction region 122 of substrate 120. Top assembly 110 includes a plurality of openings 160 substantially aligned with the openings of reactor block 100 to enable access to provide fluid (e.g., via a flow cell) to reaction region 122. It should be appreciated that leads 130 may continue through top assembly 110 to a top surface or exit through a side surface of the top assembly 110 and access may or may not be provided via openings 160.

Figure 6A:
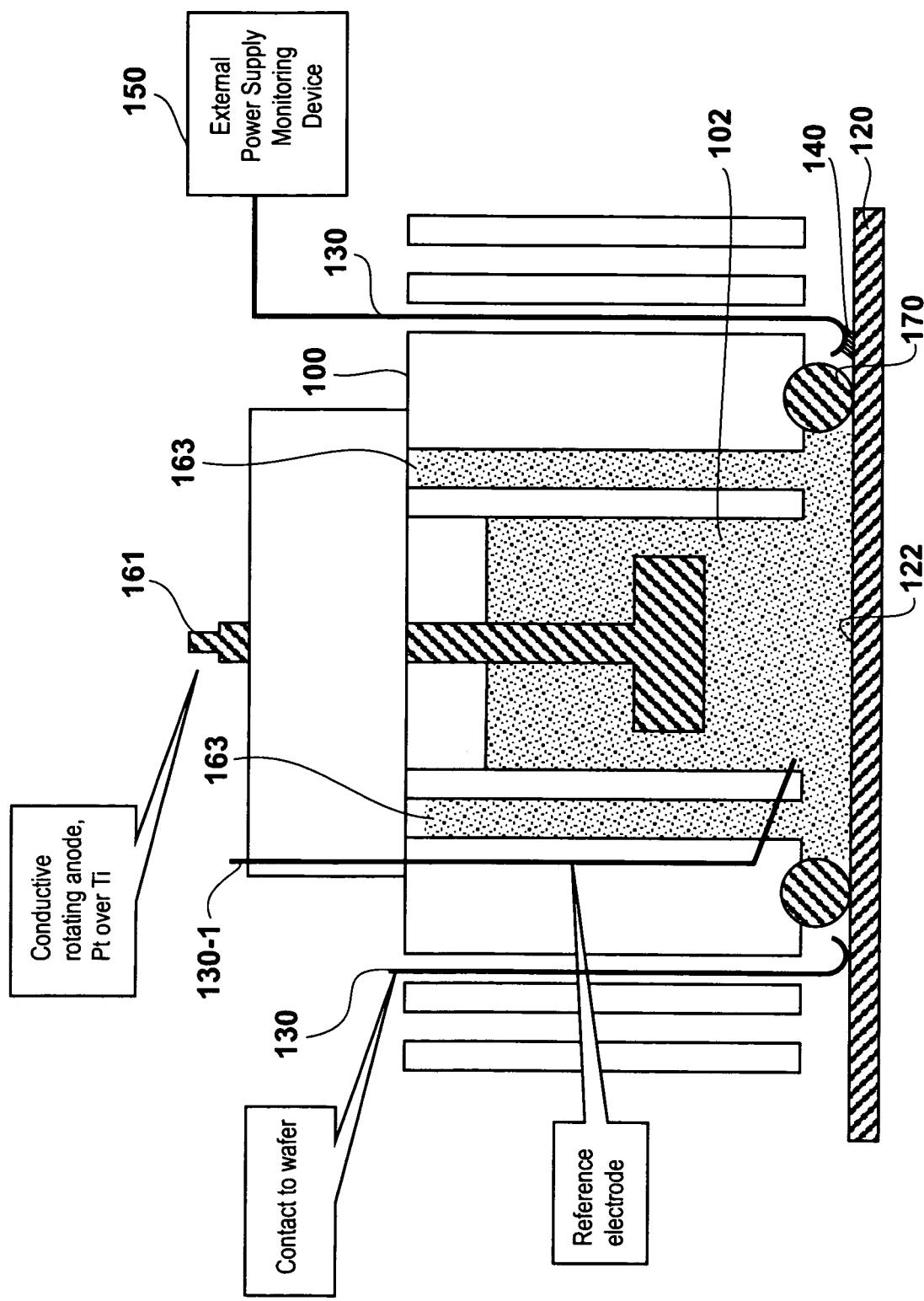
FIG. 6A is a simplified schematic diagram illustrating a reactor block in accordance with one embodiment of the invention.

FIG. 6A is a simplified schematic diagram illustrating a reactor block in accordance with one embodiment of the invention. Contacts 130 are disposed outside of reaction region 122 which is sealed through o-ring 170. It should be appreciated that the reactor of FIG. 6A is one embodiment, and a number of various permutations may be applied. For example, lead 130 may be shaped differently than is illustrated in FIG. 6A. Lead 130 may be a straight probe without a curved end making contact with contact pad 140. In one embodiment, lead 130 may be a unitary cylinder surrounding o-ring 170. As mentioned above, reaction region 122 may be isolated from other reaction regions through non-conductive area defined outside of lead 130 and surrounding reaction region 122, so as to electrically isolate the reaction region. Lead 130 is in communication with external power supply/monitoring device 150, which may be an active or passive device as mentioned above. In an alternative embodiment, lead 130 may be in communication with the fluid disposed within reaction chamber 102, which is defined within an opening of reactor block 100. A flow cell, as illustrated with regard to FIGS. 7A-C, may alternatively be inserted within the opening within reactor block 102. Lead 130-1 may be utilized as a reference electrode for an electrodeposition process within reaction chamber 102. As illustrated in FIG. 6A, fluid may be introduced through channel 161 through a stirrer and withdrawn through channel 163. Of course numerous configurations are possible for the fluid delivery and the embodiments are illustrative and not meant to be limiting. For example, fluid can be delivered over the stirrer so that the fluid is agitated by the stirrer and distributed throughout the cell.

In some embodiments, the conductive leads 130 are conductive to move with respect to the walls of the manifold to vary a distance between the conductive leads 130 and the substrate 120. For example, the reactor block 100, portions thereof, or the conductive leads 130 may be attached to a device that moves relative to the substrate 120 (e.g., using a motor). These techniques may allow the conductive leads 130 to be placed where desired within the chamber or on the substrate 120. For some techniques, e.g., electrochemical deposition, processing conditions can be varied by moving the conductive leads 130, therefore achieving varying conditions for combinatorial processing.

Figure 6B:
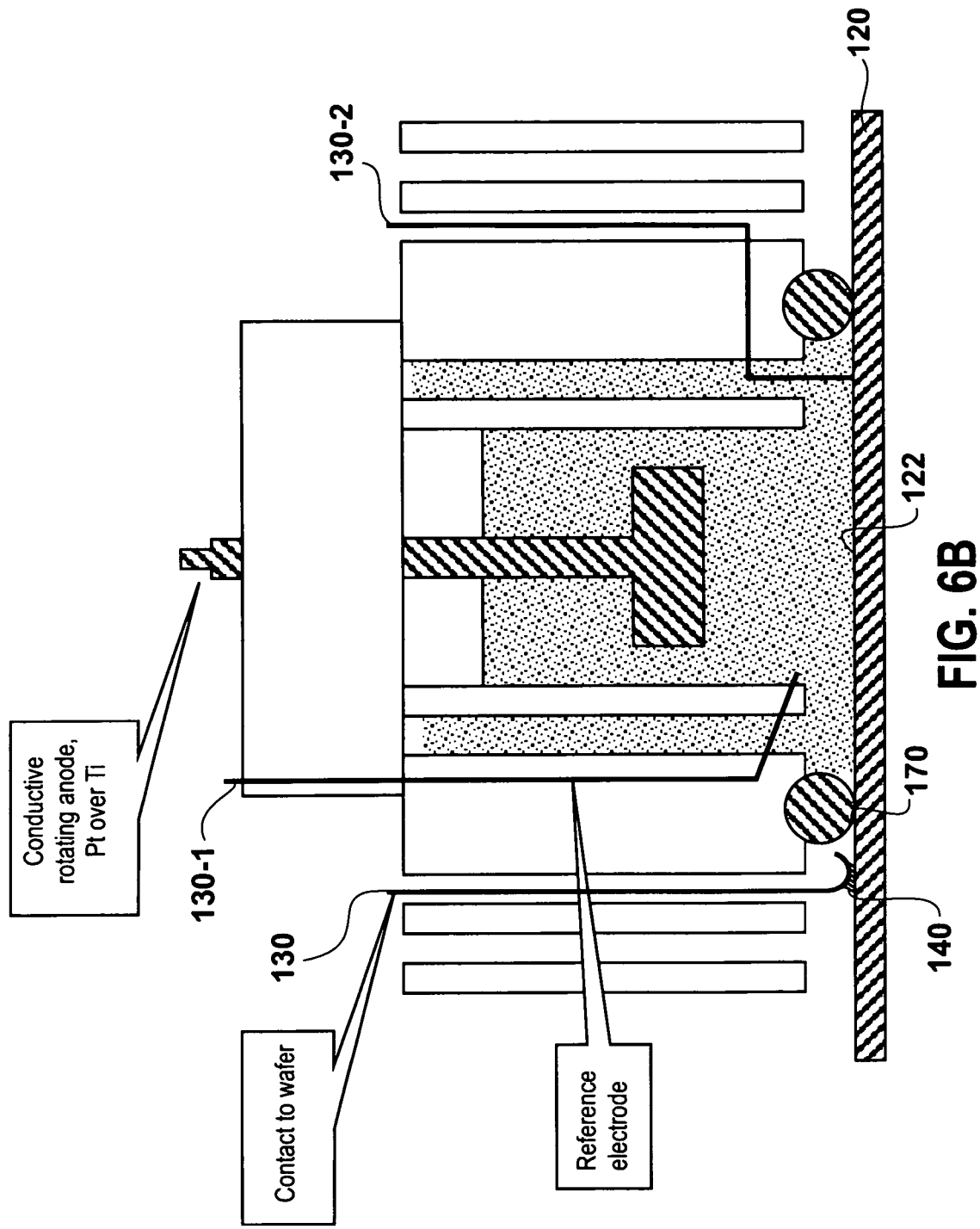
FIG. 6B is a simplified schematic diagram illustrating an alternative embodiment of the reactor block of FIG. 6A.

FIG. 6B is a simplified schematic diagram illustrating an alternative configuration for the leads providing electrical communication in accordance with one embodiment of the invention. Lead 130-1 is illustrated contacting o-ring 170. In this embodiment, o-ring 170 is conductive so as to apply a potential to region 122 of substrate 120. Alternatively, lead 130-2 is in contact with region 122 of substrate 120, as opposed to contacting an area defined outside the reactor block as illustrated in FIG. 6A. As discussed above with reference to FIG. 4, numerous configurations are available for substrate 120 and the placement of the leads. It should be appreciated that one of the various configurations for lead 130 may be applied similarly to each isolated region or any combination of the configurations may be applied similarly or differently to each isolated region. In addition, contact 140 may be electrically connected to region 122 through conductive traces (not shown) disposed on or within substrate 120 in one embodiment. It should be appreciated that in another embodiment, independent electrical contact with each region within the substrate is provided without routing on the substrate in order to capture or provide a signal to the substrate. It should be further appreciated that the substrate/reactor block configuration may include any number of reaction chambers and/or shapes. That is, while the substrates and reactor blocks are illustrated as rectangular, the reactor blocks and substrates may be other geometrical shapes, e.g., circular, elliptical, etc. It should be appreciated that leads 130, 130-1, and 130-2 of FIGS. 6A and 6B are spaced apart from the chamber volume of reaction chamber 102. The leads may be provided separately to each of the flow cells disposed within the reaction chambers in one embodiment. For example, the leads may be coupled either directly to the flow cell or to a sleeve disposed around the flow cell. In another embodiment, the leads may be embedded in a manifold forming the reaction chambers as illustrated in FIGS. 1 and 2. Furthermore, in one embodiment, the leads described herein are in electrical communication with the reaction regions of the substrate through an internal portion of the substrate and are not disposed around a peripheral region of the substrate. That is, traces disposed within the substrate under contact pad 140 may provide the electrical connections to test structures of the reaction region in order to gather characterization data in one embodiment. In another embodiment, the electrical connections may provide electricity for various processes to determine an impact that the electricity or power level has on the process. Accordingly, issues arising with resistance of thin films disposed on the surface of the substrate are avoided unlike systems that place leads around an outer periphery of the substrate. In another embodiment, multiple leads may be provided for a single reaction chamber and the multiple leads may access different test structures for characterization, where the different test structures are electrically isolated from each other.

FIGS. 7A through 7C illustrate a modular design of the flow cell that may be integrated into the embodiments of the invention. In FIG. 7A, facilities module 220 of flow cell 202 is configured to mount to process module 222. In one embodiment, the mounting is through a kinematic design where pins 230 and 231 are provided on a top surface of process module 222. On a corresponding bottom surface of base 221 of facilities module 220 a hole or slot may be defined therein to mate with pins 230 and 231. One skilled in the art will appreciate that multiple kinematic mating designs or other known alignment or locking techniques may be incorporated in order to mate and align the facilities module 220 with process module 222. The openings on base 221 and openings on the top surface of process module 222 are aligned through the kinematic coupling so that the corresponding process channels align and/or seal for fluid delivery or extraction. Facilities module 220 includes valves 204a through 204d mounted on base 221 and a plurality of inlets and outlets for process fluids 208a-d, wherein the inlets and the outlets correspond to or represent a superset of the fluid channels within base 221. Motor or drive 224 is used to provide rotation means to stir, agitate, brush, scrub, etc., as described in more detail below, or may not be used depending on the process module attached to the facilities module.

FIG. 7B is a cross sectional view of the flow cell shown in FIG. 7A in accordance with one embodiment of the invention. In FIG. 7B, pin 231 is illustrated to provide mating and alignment between the facilities portion 220 and process module portion 222. In FIG. 7B, a plurality of vacuum channels 215 may be defined within process module 222 in order to uniformly apply vacuum around annular peripheral channel 217. In one embodiment, facilities module 220 is composed of Polyetheretherketones (PEEK), while process module 222 is composed of polytetrafluoroethylene, such as TEFLON™. As facilities module 220 includes numerous flow paths that may be drilled out and may have threaded connections, PEEK or a similar inert material is sufficiently durable to withstand this machining. Facilities module 220 and process module 222 may be any suitable material compatible with the chemicals and processing conditions within the reactor region and are not limited to the materials specified above. For example, certain highly acidic or corrosive materials may not be compatible with TEFLON™. Thus, the composition of the facilities module may be different or may be the same material used for the process module and the materials are not limited to the above mentioned materials as any material compatible with the processes and applications may be utilized with the embodiments described herein.

FIG. 7C is an alternative cross sectional view of the modular flow cell of FIG. 7A in accordance with one embodiment of the invention. As illustrated, valves 204a and 204d are mounted on top of a base plate of facilities module 220, where the channels from these valves are directed to mate with corresponding inlets on a top surface of process module 222. In this embodiment, process outlet 212 delivers fluid to process module 222. Based on the valve setup and configuration of delivery lines within facility module 220, process outlet 212 can deliver any suitable fluid or combination of fluids to process module 222. Process module 222 can then distribute the fluid through any flow path, for example, the 4 fluid input through valves 204a-d may be combined into one channel in process module 222, or may remain one or more separate channels through process module 222 for possible mixing in the reaction chamber. In the embodiment of FIG. 7C a radial flow or a side-to-side flow may be provided to surface 215 of an underlying substrate through the fluid and waste paths shown. One skilled in the art will appreciate that numerous combinations of flow patterns and mixtures of flows can be accommodated through the embodiments described herein and that the embodiment of FIGS. 7A-C are exemplary and not meant to be limiting.

In one embodiment, valves 204a through 204d are three-way valves in which each valve may send process fluid to process module 222 or to waste. It should be appreciated that numerous combinations of different valves commercially available, whether the valves are two-way, three-way, etc., are easily employed into the design depending on the circumstances and desires of the user and the corresponding experiment. In process module 222, the various flows received from the facilities module are combined and distributed as desired. Again, through numerous drilling and combination sequences implemented in different process modules which may be attached to the facilities module which remains coupled to the tool, a plurality of experiments may be achieved so that multiple processing conditions may be evaluated combinatorially in an efficient manner.

Figure 8:
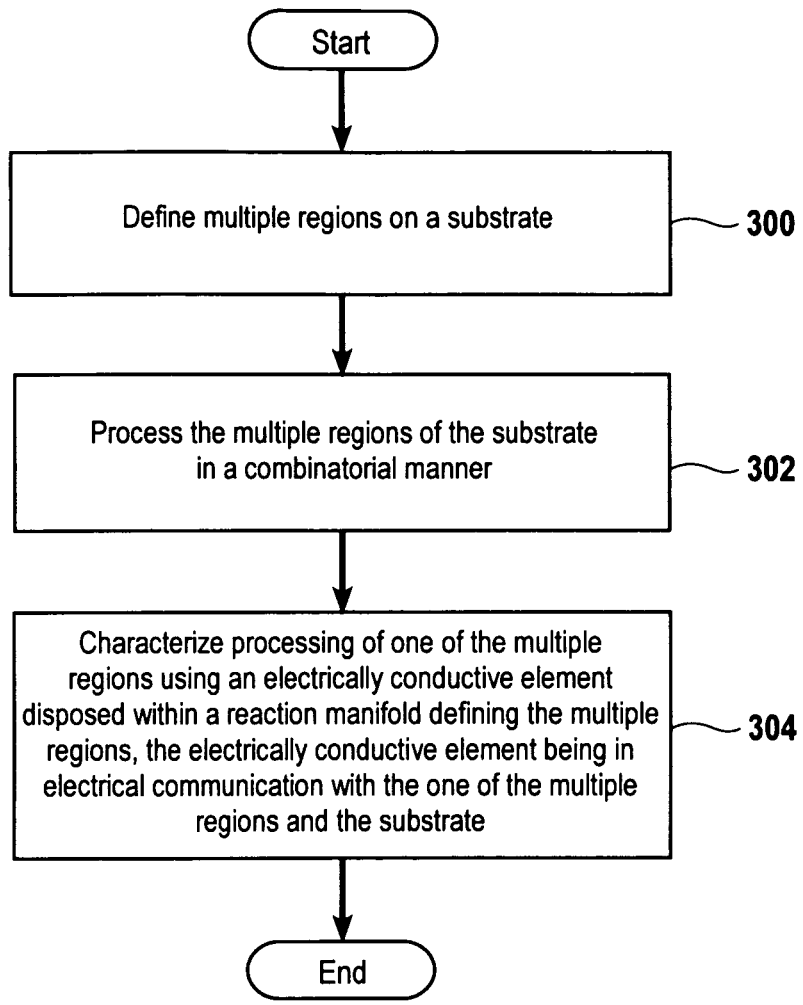
FIG. 8 is a flow chart diagram illustrating a method for combinatorial processing of a substrate in accordance with one embodiment of the invention.

FIG. 8 is a flow chart diagram illustrating a method for combinatorial processing of a substrate in accordance with one embodiment of the invention. The method initiates with operation 300 where multiple regions of a substrate are defined. In one embodiment, the multiple regions of the substrate are defined by the reactor block. In another embodiment, the multiple regions of the substrate may be pre-defined on the substrate as mentioned above. The method then proceeds to operation 302 where the multiple regions of the substrate are processed in a combinatorial manner. Here, different regions of the substrate may be processed differently while the electrical properties may be altered through the electrical contacts for the different regions. In one embodiment, the electrical properties may be altered similarly for each region, however, the electrical properties can be altered differently for the different regions. One skilled in the art will appreciate that numerous processing operations related to wet chemical processing may occur within the reaction chambers. These include, but are not limited to, electroless deposition, electrodeposition, electropolishing, cleaning processes, etc. Furthermore, the processing may take place in a serial nature, parallel nature, or fast serial nature (i.e., a parallel-serial nature) where a subset of the reactor blocks is processed at a time. The method then proceeds to operation 304 where the processing is characterized for one of the multiple regions using an electrically conductive element disposed within the reaction manifold. In one embodiment, the electrically conductive element is in electrical communication with a monitoring device external to the reactor block. This device can actively modify the reaction conditions, e.g., the electrical potential applied for a reaction taking place. Alternatively, the monitoring device may passively monitor the reaction taking place, e.g., electrical properties, temperature, etc. In another embodiment, the system may actively modify the reaction conditions in response to monitoring the reaction. In a further embodiment, characterizing may include tracking a time dependent characteristic and comparing differently processed regions (e.g., reaction regions 122) in real time.

It should be appreciated that the embodiments described herein accommodate a reactor having electrical contacts on a surface of a substrate undergoing combinatorial processing. The contacts may be positioned within a reaction region or outside a reaction region. The contacts, coupled to leads in communication with monitoring devices or power supplies external to the reaction chambers, enable manipulation and/or monitoring of the reactions taking place in the reaction chambers. These localized contacts provide for accurate measurements and providing accurate potentials to each of the isolated regions, even as seed layers become thinner and give rise to discontinuities when attempting to connect to a peripheral region of the substrate being evaluated. As mentioned above, a monitoring circuit may measure capacitance as a chemical reaction is taking place. In this embodiment, the test substrate includes a capacitor circuit. Some exemplary operations where this would be useful include electro-less depositions and etching operations. One skilled in the art will appreciate that resistance or other characteristics of the regions may also be measured through this embodiment. In another embodiment a resistance thermal detector (RTD) or thermistor may be included in the test substrate, thereby enabling the temperature of the substrate to be monitored while the reaction is taking place. For example, the RTD may be used to measure the temperature in a reaction chamber, or multiple RTDs may be used for multiple reaction chambers.

Through these embodiments, the substrate may be heated and the temperature measured to provide a global map of the temperature distribution across the substrate, as well as provide information locally for the temperature conditions of the individual reaction chambers. In embodiments influencing the reaction taking place, the contacts may be connected to a voltage potential plane, thereby enabling the voltage potential for the reaction to be controlled by external equipment. In another embodiment, the voltage potential planes are separated or isolated from voltage potential planes in adjacent reaction regions so that the voltage may be varied from region to region, further enhancing the combinatorial capabilities of the system for electrodeposition processes, among other semiconductor processes in which a variable voltage may impact a result of the process. Thus, the embodiments enable real time comparative analysis of differential processing through the conductive leads and corresponding power supply/monitoring equipment.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A multiple chamber system comprising:
a reaction manifold, the reaction manifold having a top surface and a bottom surface, the reaction manifold having a plurality of through-ways running from the top surface to the bottom surface, each of the plurality of throughways having an open top communicated with the top surface and an open bottom communicated with the bottom surface, the plurality of throughways defining a plurality of reaction chambers when in contact with a substrate, a top surface of the substrate forming a bottom surface for each of the plurality of reaction chambers; and
a plurality of electrically conductive elements, wherein a first end of the plurality of electrically conductive elements protrudes from the top surface of the reaction manifold, wherein at least a portion of the plurality of electrically conductive elements is embedded inside a wall of the reaction manifold, wherein a second end of the plurality of electrically conductive elements protrudes from the bottom surface of the reaction manifold to enable electrical contact with at least one of the substrate and the plurality of reaction chambers.

2. The system as recited in claim 1, wherein the plurality of electrically conductive elements are spaced away from the plurality of reaction chambers.

3. The system as recited in claim 1, wherein the electrical contact is provided through a trace embedded in the substrate, the trace extending between a pad on a surface of the substrate and the reaction chambers, wherein one of the electrically conductive elements are in contact with the pad.

4. The system as recited in claim 3 wherein a reaction region of the top surface of the substrate is defined within the reaction chamber includes structures.

5. The system as recited in claim 1 wherein the plurality of conductive elements are in electrical communication with the reaction chambers to enable one of probing for in situ measurements of processing reactions or to facilitate ex situ analysis of the measurements.

6. The system as recited in claim 1 wherein the plurality of conductive elements are in electrical communication with the substrate to enable probing for in situ measurements of processing reactions in the reaction chambers, wherein the processing reaction are different within different reaction chambers.

7. The system as recited in claim 6 wherein the substrate is a testing substrate configured to measure at least one of resistance, capacitance, and leakage.

8. The system as recited in claim 1 further including a modular head in fluid communication with the reaction chambers to regulate a presence of processing fluids in the chamber.

9. The system as recited in claim 1 further including a plurality of removable sealing sleeves, each of which is disposed along inner side surfaces within one of the plurality of through-ways forming a fluid tight seal between the one of the plurality of through-ways and the substrate.

10. The system as recited in claim 1 wherein a subset of the plurality of reaction chambers has a sub-portion of the plurality of electrically conductive elements disposed therein.

11. The system of claim 1, wherein the reaction chambers form regions on the substrate.

12. The system of claim 1, wherein the conductive elements enable real time comparative analysis of differential processing.

13. The system of claim 1, wherein the conductive elements enable independent electrical contact with each region within the substrate without routing on the substrate.

14. The system as recited in claim 1, wherein at least one of the plurality of electrically conductive elements is totally embedded within the wall of the reaction manifold from a top surface of the reaction manifold to a bottom of the reaction manifold, and wherein the at least one of the plurality of electrically conductive elements traverses through the reaction manifold to connect with the substrate.

15. The system as recited in claim 1, wherein at least one of the plurality of electrically conductive elements proceeds from within the wall of the reaction manifold to form contact with the substrate outside a reaction chamber of the plurality of reaction chambers.

16. The system as recited in claim 1, wherein at least one of the plurality of electrically conductive elements proceeds from within the wall of the reaction manifold into a reaction chamber of the plurality of reaction chambers and connects with the substrate.

17. The system as recited in claim 1, wherein at least one of the plurality of electrically conductive elements proceeds from within the wall of the reaction manifold into a reaction chamber of the plurality of reaction chambers and connects with the substrate.

18. A tool for processing and analyzing a substrate having site isolated regions, comprising:
   a plurality of reaction chambers each partially defined by at least one chamber wall having a wall thickness, a top surface and a bottom surface, the plurality of reaction chambers having a top opening communicated with the top surface and a bottom opening communicated with the bottom surface, the bottom opening configured to seal against a top surface of the substrate thereby defining an isolated region on the top surface of the substrate, and
   conductive elements, extending along the at least one chamber wall and embedded within the at least one chamber wall to be spaced apart from corresponding reaction chamber, a first end of the conductive elements protruded from the top surface, a second end of the conductive elements extended from the bottom surface to be in electrical communication with corresponding isolated region associated therewith.

19. The system as recited in claim 18 wherein the conductive elements are in electrical communication with corresponding contacts substantially aligned with the conductive element to provide power to a conductive surface on the substrate.

20. The system as recited in claim 18 wherein the conductive elements form a contact with the substrate outside the corresponding reaction chambers.

21. The system as recited in claim 18 wherein the conductive elements form a contact with the substrate inside the corresponding reaction chambers.

22. The system as recited in claim 18 wherein the conductive elements are in electrical communication with the corresponding reaction chamber to measure reaction processes therein.

23. The system as recited in claim 18 wherein the conductive elements are configured to move with respect to the at least one chamber wall to vary a distance between the conductive elements and the substrate.

24. The system as recited in claim 23, wherein each of the plurality of the reaction chambers has a substantially same configuration to allow for comparison of processing performed in each of the plurality of reaction chambers, and wherein the processing performed in a subset of the plurality of reaction chambers is different than a remainder of the plurality of reaction chambers.

25. A tool for processing and analyzing a substrate having site isolated regions, comprising:
   a plurality of reaction chambers each partially defined by at least one chamber wall having a wall thickness and a top surface, the plurality of reaction chambers having a top opening communicated with the top surface and a bottom opening, the bottom opening configured to seal against a top surface of the substrate thereby defining an isolated region on the top surface of the substrate, and
   conductive elements, extending along the at least one chamber wall and embedded within the at least one chamber wall to be spaced apart from corresponding reaction chamber, a first end of the conductive elements protruded from the top surface, a second end of the conductive elements extended from the chamber wall to be in contact with a fluid in corresponding reaction chambers.

26. The system as recited in claim 25 wherein the conductive elements protrude into the corresponding reaction chambers and are spaced-apart from the substrate.

27. The system as recited in claim 25 wherein the conductive elements are configured to move with respect to the at least one chamber wall to vary a distance between the conductive elements and the substrate.

* * * * *